US009537705B1

(12) United States Patent
Dutch et al.

(10) Patent No.: US 9,537,705 B1
(45) Date of Patent: *Jan. 3, 2017

(54) GLOBAL SPACE REDUCTION GROUPS

(75) Inventors: Michael John Dutch, Saratoga, CA (US); Christopher Hercules Claudatos, San Jose, CA (US); William Dale Andruss, Minneapolis, MN (US); Bruce David Leetch, Mason, OH (US)

(73) Assignee: EMC IP Holding Company LLC, Hopkinton, MA (US)

( * ) Notice: Subject to any disclaimer, the term of this patent is extended or adjusted under 35 U.S.C. 154(b) by 643 days.

This patent is subject to a terminal disclaimer.

(21) Appl. No.: 12/416,145

(22) Filed: Mar. 31, 2009

(51) Int. Cl.
*H04L 29/08* (2006.01)
*H03M 7/30* (2006.01)
*H04L 29/06* (2006.01)

(52) U.S. Cl.
CPC ............ *H04L 29/0604* (2013.01); *H03M 7/30* (2013.01); *H04L 29/08783* (2013.01); *H04L 29/08792* (2013.01); *H04L 29/08801* (2013.01)

(58) Field of Classification Search
CPC .......... H04L 29/0604; H04L 29/08783; H04L 29/08792; H03M 7/30
USPC .................. 709/214; 711/161, 162
See application file for complete search history.

(56) References Cited

U.S. PATENT DOCUMENTS

| | | | |
|---|---|---|---|
| 6,070,228 A | 5/2000 | Belknap et al. | |
| 6,415,296 B1 * | 7/2002 | Challener et al. | |
| 6,694,447 B1 | 2/2004 | Leach et al. | |
| 6,912,629 B1 | 6/2005 | West et al. | |
| 7,100,007 B2 * | 8/2006 | Saika | G06F 11/1451 709/218 |
| 7,401,194 B2 * | 7/2008 | Jewell | G06F 11/1464 707/999.202 |
| 7,552,358 B1 | 6/2009 | Asgar-Deen et al. | |
| 7,702,781 B2 * | 4/2010 | Devolites | 709/224 |
| 7,882,077 B2 * | 2/2011 | Gokhale et al. | 707/673 |
| 2003/0217082 A1 | 11/2003 | Kleiman et al. | |
| 2004/0034808 A1 | 2/2004 | Day et al. | |
| 2004/0158582 A1 | 8/2004 | Takagi et al. | |
| 2005/0071391 A1 | 3/2005 | Fuerderer et al. | |
| 2005/0131990 A1 | 6/2005 | Jewell | |
| 2006/0094419 A1 * | 5/2006 | Katou | 455/425 |
| 2006/0112303 A1 | 5/2006 | Levy | |
| 2006/0123212 A1 | 6/2006 | Yagawa | |
| 2007/0016695 A1 | 1/2007 | Rabbers et al. | |
| 2007/0208783 A1 | 9/2007 | Midgley et al. | |
| 2007/0208826 A1 | 9/2007 | Devolites | |

(Continued)

OTHER PUBLICATIONS

U.S. Appl. No. 12/416,147, filed Apr. 1, 2009, Dutch, Michael John.

(Continued)

*Primary Examiner* — Asghar Bilgrami
(74) *Attorney, Agent, or Firm* — John Gould; Theodore A. Chen; Krishnendu Gupta

(57) ABSTRACT

A method, article of manufacture, and apparatus for efficiently backing up information are disclosed. In an embodiment, this may comprise receiving information about a plurality of clients, grouping clients into client groups based on the information, transmitting data from a client group to an intermediate shared storage at a time convenient for the client group, transferring the data to a server, and storing the data in a server storage.

9 Claims, 6 Drawing Sheets

(56) References Cited

U.S. PATENT DOCUMENTS

| | | | |
|---|---|---|---|
| 2007/0283017 A1* | 12/2007 | Anand | G06F 11/1458 709/226 |
| 2009/0172322 A1 | 7/2009 | Gilpin et al. | |
| 2009/0249006 A1* | 10/2009 | Boldt | G06F 11/1461 711/162 |
| 2010/0058013 A1* | 3/2010 | Gelson et al. | 711/162 |
| 2010/0064166 A1* | 3/2010 | Dubnicki et al. | 714/4 |
| 2010/0070725 A1* | 3/2010 | Prahlad et al. | 711/162 |
| 2011/0093471 A1* | 4/2011 | Brockway et al. | 707/747 |

OTHER PUBLICATIONS

U.S. Appl. No. 12/416,139, filed Mar. 31, 2009, Dutch, Michael John.

U.S. Appl. No. 12/416,144, filed Mar. 31, 2009, Dutch, Michael John.

* cited by examiner

GLOBAL SPACE REDUCTION GROUPS

CROSS-REFERENCE TO RELATED APPLICATIONS

This application is related to co-pending U.S. patent application Ser. No. 12/416,139 for Opportunistic Global Space Reduction and filed concurrently herewith, which is incorporated herein by reference for all purposes; co-pending U.S. patent application Ser. No. 12/416,144 for Complementary Space Reduction and filed concurrently herewith, which is incorporated herein by reference for all purposes; and co-pending U.S. patent application No. 12/416,147 for Opportunistic Restore and filed concurrently herewith, which is incorporated herein by reference for all purposes.

FIELD OF THE INVENTION

The present invention relates generally to information storage systems, and more particularly, to systems and methods of efficiently backing up information.

BACKGROUND OF THE INVENTION

Backup applications read data from sources and store copies of source data in different locations. Backing up data is important because it enables users of data to access data in the event an original copy of data is corrupted or destroyed.

Typically, backup copies of data are stored in remote locations. Backup applications may utilize a network connection to read data from a client and store copies of the client's data in a data warehouse hundreds of miles away.

However, many of today's clients have an intermittent connection to a network connection. For example, a client may include a laptop which frequently moves between worksites, or a cell phone which roams in and out of service, among others. If a network connection is unavailable, backup applications cannot remotely perform a backup.

There is a need, therefore, for an improved method, article of manufacture, and apparatus for backing up information.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION

Figure 1:
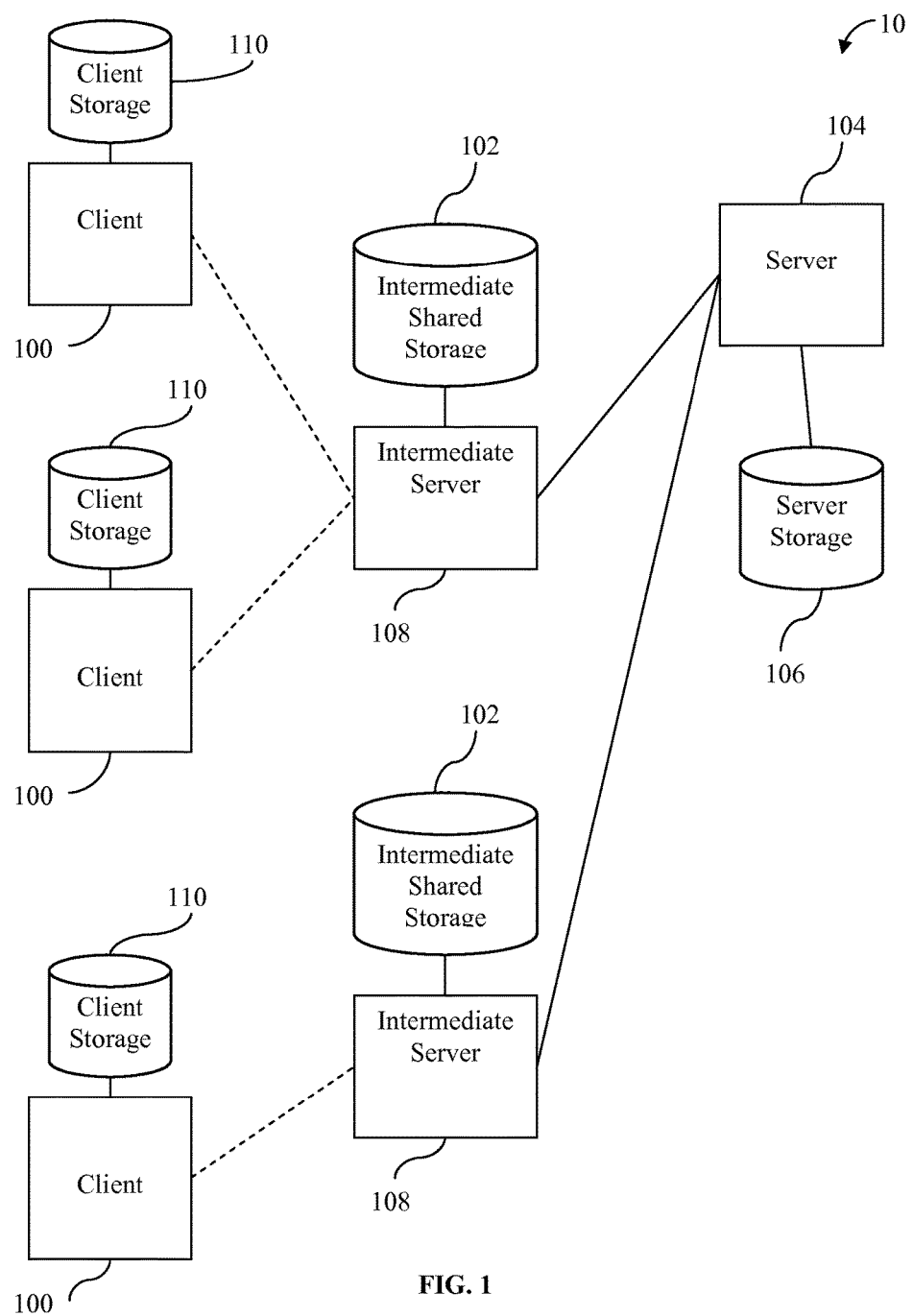
FIG. 1 is a diagram of an embodiment of a backup system in accordance with the invention.

A detailed description of one or more embodiments of the invention is provided below along with accompanying figures that illustrate the principles of the invention. While the invention is described in conjunction with such embodiment(s), it should be understood that the invention is not limited to any one embodiment. On the contrary, the scope of the invention is limited only by the claims and the invention encompasses numerous alternatives, modifications, and equivalents. For the purpose of example, numerous specific details are set forth in the following description in order to provide a thorough understanding of the present invention. These details are provided for the purpose of example, and the present invention may be practiced according to the claims without some or all of these specific details. For the purpose of clarity, technical material that is known in the technical fields related to the invention has not been described in detail so that the present invention is not unnecessarily obscured.

It should be appreciated that the present invention can be implemented in numerous ways, including as a process, an apparatus, a system, a device, a method, or a computer readable medium such as a computer readable storage medium containing computer readable instructions or computer program code, or as a computer program product, comprising a computer usable medium having a computer readable program code embodied therein. In the context of this disclosure, a computer usable medium or computer readable medium may be any medium that can contain or store the program for use by or in connection with the instruction execution system, apparatus or device. For example, the computer readable storage medium or computer usable medium may be, but is not limited to, a random access memory (RAM), read-only memory (ROM), or a persistent store, such as a mass storage device, hard drives, CDROM, DVDROM, tape, erasable programmable read-only memory (EPROM or flash memory), or any magnetic, electromagnetic, infrared, optical, or electrical means system, apparatus or device for storing information. Alternatively or additionally, the computer readable storage medium or computer usable medium may be any combination of these devices or even paper or another suitable medium upon which the program code is printed, as the program code can be electronically captured, via, for instance, optical scanning of the paper or other medium, then compiled, interpreted, or otherwise processed in a suitable manner, if necessary, and then stored in a computer memory. Applications, software programs or computer readable instructions may be referred to as components or modules. Applications may be hardwired or hard coded in hardware or take the form of software executing on a general purpose computer or be hardwired or hard coded in hardware such that when the software is loaded into and/or executed by the computer, the computer becomes an apparatus for practicing the invention. Applications may also be downloaded in whole or in part through the use of a software development kit or toolkit that enables the creation and implementation of the present invention. In this specification, these implementations, or any other form that the invention may take, may be referred to as techniques. In general, the order of the steps of disclosed processes may be altered within the scope of the invention.

An embodiment of the invention will be described with reference to a backup system in the form of a storage system configured to store files, but it should be understood that the principles of the invention are not limited to data storage systems. Rather, they are applicable to any system capable of storing and handling various types of objects, in analog, digital, or other form. Although terms such as document, file, object, etc. may be used by way of example, the principles of the invention are not limited to any particular form of representing and storing data or other information; rather, they are equally applicable to any object capable of representing information.

Disclosed herein are a method and system to efficiently backup information. Typically, backups are conducted according to a set schedule. For example, a backup may occur every day, or every week. However, such backups do not take into account the connectivity or availability of a client. For example, a client may be behind a firewall and unauthorized to connect to a server, or a client may be disconnected from a network. Nor do such backups consider the availability of a server. For example, a server may be too busy to perform a backup when convenient for the client.

Furthermore, many backups perform space reduction, such as deduplication or compression, on data. This may include identifying global redundant data (redundant data across all clients) and storing a single instance copy of the global redundant data on a server storage. If a server was unavailable, a backup application would be unable to determine previously identified single instance copies of data.

The present invention allows for backup systems to perform global space reduction opportunistically. In some embodiments, each client performs space reduction on its own data. When convenient (e.g. connected, available, authorized, etc.), a client may store its space reduced data in an intermediate shared storage. Similarly, a server may at its convenience retrieve client space reduced data from the intermediate shared storage.

FIG. 1 illustrates an embodiment of the present invention. A backup system 10 comprises clients 100, intermediate shared storages 102, backup server 104, server storage 106, intermediate servers 108, and client storages 110. Clients 100 are the sources of backup data, and may be mobile or non-mobile. Mobile clients are clients which frequently change location, such as cell phones or laptops. Non-mobile clients are clients which remain in the same location, such as desktop computers. Client storages 110 are storage devices in which clients 100 may store data. Intermediate shared storages 102 are storage devices in which clients 100 may store data. Intermediate servers 108 retrieves data from intermediate shared storages 102. Server storage 106 is available for server 104 to store data in. Intermediate servers 108 manage and implement policies for intermediate shared storages 102. Though FIG. 1 shows intermediate servers 108 to manage policies for intermediate shared storages 102, backup server 104 may also centrally manage policies for backup system 10. It should be understood that any type of storage may be used, such as disk drives, tape drives, content addressable storage, flash memory, optical drives, CD-Recordable drives, DVD-Recordable drives, non-volatile storage, etc.

Mobile clients commonly have intermittent connections with a network. For example, cell phones may roam in and out of service, and laptops may be carried in and out of networks. Networks also routinely implement firewalls, which may limit the connectivity of mobile clients. Due to intermittent connections, it is very difficult for backup systems to schedule a backup in which all clients (mobile and non-mobile) are available.

As shown by dashed lines connecting client 100 and intermediate server 108, any or all clients 100 may have an intermittent connection to intermediate servers 108. Security is enhanced when clients use standard network storage protocols (e.g., NFS or CIFS) to transfer data to or from intermediate servers because non-standard ports need not be opened in a firewall.

Intermittent connections present further difficulties for backup systems utilizing global space reduction. For example, several clients may have a copy of an email attachment. A backup system utilizing global deduplication, a form of space reduction, would store only a single copy of the email attachment in a server storage. However, if a client was temporarily disconnected from the server, the disconnected client would be unable to access the server and unable to identify redundant data. Note that redundant data in the email attachment could be eliminated at a file-level or subfile-level.

Intermediate shared storages address this problem. In some embodiments, clients with an intermittent connection may store their data in intermediate shared storages when a connection is available. For example, a laptop at home may not have authorization to store data in an intermediate shared storage, but when taken to the office, would be connected to a corporate intranet and allowed to access the intermediate shared storage. As shown by FIG. 1, a plurality of intermediate shared storages may be available to a plurality of clients.

Clients may store their data in intermediate shared storages in a variety of ways. For example, a client may store its data in a unique folder in an intermediate shared storage, separating its data from the data of other clients. A client may also store its data in a general folder in an intermediate shared storage, thereby mixing its data with the data of other clients. Though FIG. 1 illustrates a plurality of clients connecting to a single intermediate shared storage, the present invention allows for clients to connect to multiple intermediate shared storages. A single client may connect to multiple intermediate shared storages.

Clients may perform any number of space reduction methods on their data before storing their data in an intermediate shared storage. This may be preferable due to limited space on a client, limited bandwidth, etc. In some embodiments, clients may perform space reduction, such as delta-based deduplication. Delta-based deduplication, also known as byte-level data differencing or delta encoding, stores or transmits data in the form of differences from a baseline copy. The baseline copy is a complete point-in-time copy of the data used to recreate other versions of the data. These other versions of the data may include updates or other modifications of the baseline copy. Delta-based deduplication has advantages when utilized by a client. Since clients transmit versions serially, the most a client would lose if a network connection was suddenly lost would be the version being transmitted (e.g. versions 1 and 2 transferred successfully, transmission of version 3 interrupted, can resume transfer starting with version 3). Clients need not perform space reduction on client data.

If a network connection is highly intermittent (frequent interruptions), a transfer queue may be utilized. For example, if a client attempted to store four files in an intermediate shared storage, but the network connection was lost during transmission of the second file, a transfer queue would include the last three files. When the network connection is restored, the client would begin from the transfer queue, instead of attempting to store all four files. By storing data serially via a transfer queue, the most data that would have to be re-transmitted if a connection was lost would be the last data sent when interrupted.

By having clients actively store client data in intermediate shared storage, the problem of individual client connectivity is resolved. Clients may locally space reduce their data, and transmit their data according to each individual client's connectivity. The availability of a server is no longer an issue (from the client's viewpoint), nor is the availability of other clients. A client may globally space reduce its data, even if every other client is disconnected from the network during the space reduction, and may also asynchronously store their data in an intermediate shared storage.

After an intermediate shared storage data has client data stored in it, the intermediate server may conduct further space reduction. The intermediate server need not perform the same space reduction method performed by any of its client. For example, clients may perform delta-based deduplication on client data, while a server may perform commonality factoring deduplication on data in the intermediate shared storage.

Commonality factoring, also known as hash-based deduplication, defines and computes atomic units of data, providing a mechanism for finding subsets of the data that are replicated across time or within and across data sets, and reducing or eliminating the replicated data.

Figure 6:
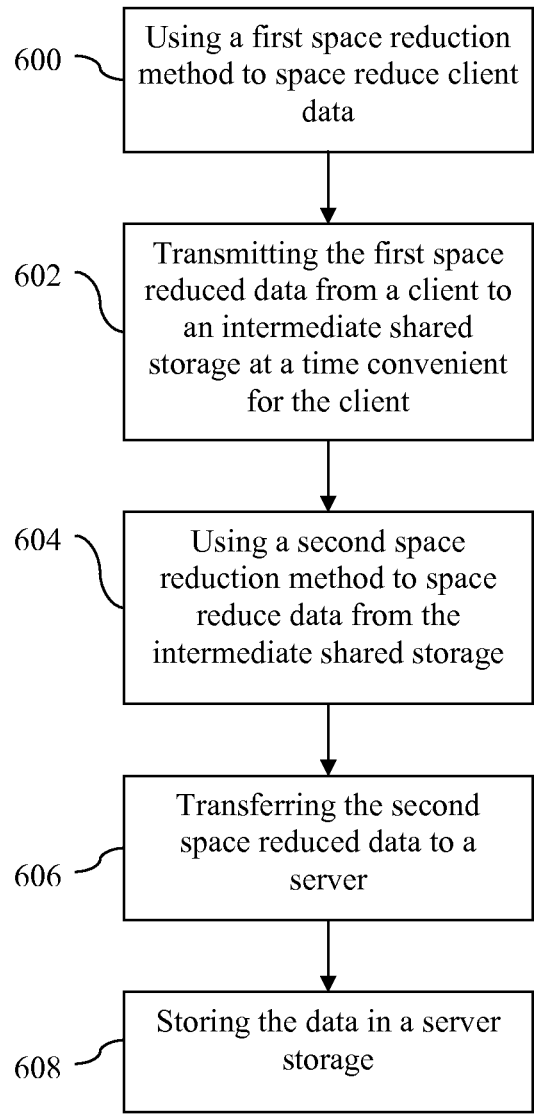
FIG. 6 is a flowchart of a method to backup information in accordance with the invention.

FIG. 6 illustrates a process for using a plurality of space reduction methods, comprising using a first space reduction method to space reduce client data in step 600, transmitting the first space reduced data from a client to an intermediate shared storage at a time convenient for the client in step 602, using a second space reduction method to space reduce data from the intermediate shared storage in step 604, transferring the second space reduced data to a server in step 606, and storing the data in a server storage in step 608.

In some embodiments, an intermediate server is always connected to a server. For example, an intermediate server may be inside a corporate firewall, and a server may designate a specific port for the intermediate server. Since an intermediate server is always connected to a server, the connectivity of clients is no longer an issue (from the server's viewpoint).

The intermediate server may conduct a space reduction of data in the intermediate shared storage when it is convenient for the server (e.g. low server load, sufficient bandwidth, etc.), and store the space reduced intermediate shared storage data in a server storage. Since the data in the intermediate shared storage data is a compilation of data from every client, the intermediate server may perform reduction globally, i.e. spanning all of its clients. The intermediate server manages the space on the intermediate shared storage according to policies that may be established by the server. This allows subsequent client backups and global space reduction to be performed without running out of space. If new data is found in the intermediate shared storage, the server may retrieve the new data and store it in the server storage. If no new data is found in the intermediate shared storage, the intermediate shared storage data may be discarded.

In some embodiments, since the data in an intermediate shared storage is a compilation of data from every client, by space reducing the intermediate shared storage data, the intermediate server is performing a global space reduction. It should be noted that the intermediate shared storage is passive throughout the process—clients store data in the intermediate shared storage when it is convenient for clients, and intermediate servers or servers perform space reduction on the intermediate shared storage data when it is convenient for intermediate servers and servers.

Since data stored in the server storage is global space reduced data, data stored in intermediate shared storages may be deleted by the intermediate servers. In this way, intermediate shared storage acts like a buffer—temporarily storing client data until a server processes and retrieves the data. In some embodiments, intermediate servers decide when to delete data from the intermediate shared storage based on a policy.

Policies may vary depending on user preference. If a user desired a faster restore process (e.g. data on server is used to restore client to a previously stored state), it may be preferable to retain some data on the intermediate shared storage. Clients may receive some data from the intermediate shared storage, instead of the server, thereby conserving bandwidth between the server and intermediate shared storage.

Figure 3:
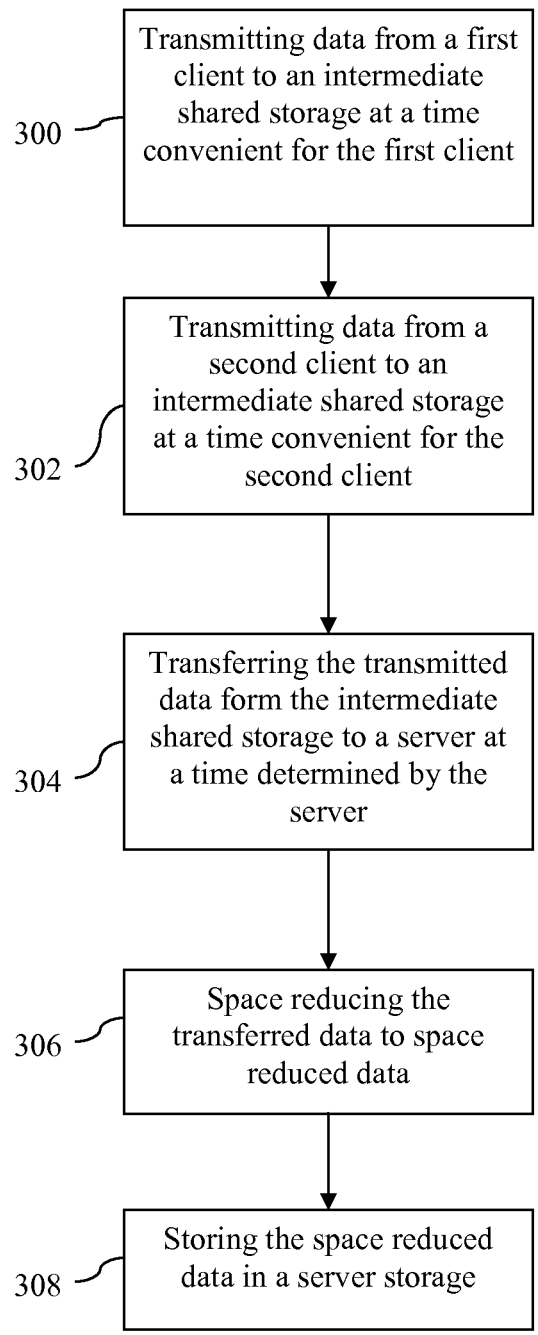
FIG. 3 is a flowchart of a method to backup information in accordance with the invention.

FIG. 3 illustrates a flowchart for backing up information in one embodiment of the present invention. In step 300, data is transmitted from a first client to an intermediate shared storage at a time convenient for the first client. In step 302, data is transmitted from a second client to an intermediate shared storage at a time convenient for the second client. In step 304, the transmitted data is transferred from the intermediate shared storage to a server at a time determined by the server. In step 306, the transferred data is space reduced. In step 308, the space reduced data is stored in a server storage.

The above method may also utilize source space reduction. Data at the intermediate shared storage (the source) is space reduced before being transferred to the server. It may be preferable to perform space reduction at the source of the data because it lowers the bandwidth required to retrieve the data from the source. In some embodiments, source space reduction may be more desirable in terms of scalability, efficiency, and availability.

The present invention is equally capable of target space reduction. Target space reduction is when space reduction occurs at the target. For example, a server may retrieve non-space reduced data from an intermediate shared storage, store the non-space reduced data in a server storage, and then perform space reduction on the data in the server storage. This may be preferable when bandwidth is not an issue, and the server storage is capable of accommodating a large amount of redundant data.

Though some embodiments include one intermediate shared storage containing data from every client, some embodiments may include multiple intermediate shared storages. Accordingly, data across multiple intermediate shared storages may constitute global data. Furthermore, there may be multiple levels of intermediate shared storages.

Figure 2:
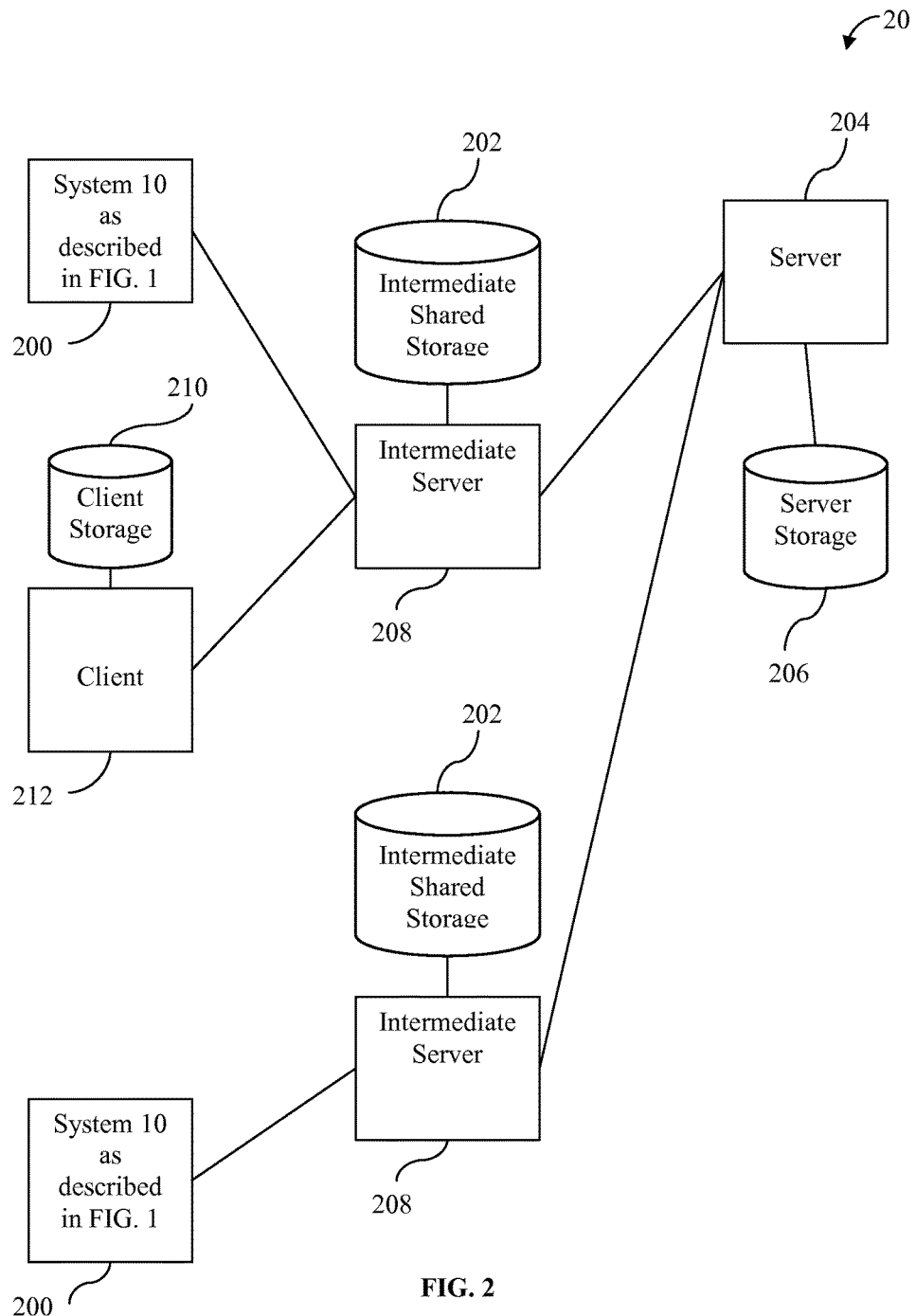
FIG. 2 is a diagram of an embodiment of a backup system in accordance with the invention.

FIG. 2 illustrates one embodiment of the present invention utilizing multiple levels of intermediate shared storages. A backup system 20 comprises the backup system 10 as described in FIG. 1, 200, clients 212, intermediate shared storages 202, backup server 204, server storage 206, intermediate servers 208, and client storages 210. Systems 10 as described in FIG. 1 200 and clients 212 are the sources of backup data. Client storages 210 are storage devices in which clients 200 may store data. Intermediate shared storages 202 are storage devices in which systems 10 as described in FIG. 1 200 may store data. Intermediate server 208 retrieves data from intermediate shared storages 202. Server storage 206 is available for server 204 to store data in. Intermediate servers 208 manage policies for intermediate shared storages 202. Though FIG. 2 shows intermediate servers 208 to enforce policies for intermediate shared storages 202, backup server 204 may also centrally establish these policies.

Depending on the role, an intermediate shared storage may behave in an active capacity or a passive capacity. For example, server 104, though a server in FIG. 1, is an intermediate shared storage in FIG. 2. Server 104 receives data from other intermediate shared storages. When receiving data, Server 104 is passive. Server 104 also sends data to other intermediate shared storages as depicted in FIG. 2. When sending data, Server 104 is active.

The connections between the various levels of intermediate shared storages may be intermittent or constant. Firewalls may also be placed at various connections between the different levels in order to enhance security. If the connection is intermittent, the active intermediate shared storage transfers data when it is convenient for it. Much like how clients may transfer or space reduce data without regard to other clients' connections or the availability of the server, active intermediate shared storages may transfer or space reduce data without regard to other similarly situated shared storages (e.g. same level intermediate shared storage), or the availability of the "server" (the "server" may be another intermediate shared storage device).

As shown by intermediate server 208 in FIG. 2, any level intermediate shared storage may utilize a server to assist in space reduction, managing policies, carrying out policies, or other processes when the intermediate shared storage behaves in an active capacity.

It should be noted that space reduction need not be performed at every intermediate shared storage. However, space reduction must be performed such that all client data can be compared with each other, allowing redundancies throughout all client data to be identified and removed. This may be done by server 204 with target space reduction or by intermediate servers 208 with source space reduction. In all cases, the data stored in server storage 206 is globally space reduced.

Depending on user preference, clients may be grouped together into client groups. For example, one client group may include people from legal, while another client group may include people from development. This may be preferable since people from the same department are more likely to have similar data. In some embodiments, a client group may have a unique folder in an intermediate shared storage. In some embodiments, a client group may have an entire intermediate shared storage.

Figure 5:
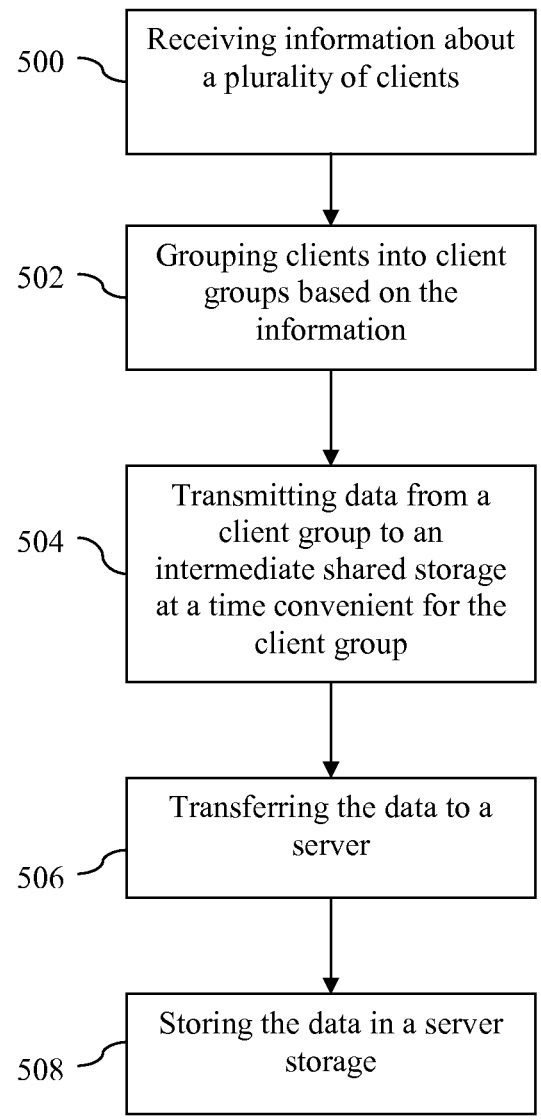
FIG. 5 is a flowchart of a method to backup information in accordance with the invention.

FIG. 5 illustrates a process to group clients in an embodiment of the invention, comprising receving information about a plurality of clients in step 500, grouping clients into client groups based on the information in step 502, transmitting data from a client group to an intermediate shared storage at a time convenient for the client group in step 504, transferring the data to a server in step 506, and storing the data in a server storage in step 508.

In some embodiments, it may not be preferable to mix data from different clients. For example, if a client was Company A, and another client was Company B, a backup provider may not be allowed to mix data from Company A and Company B. A server would therefore not be able to perform global deduplication, since it would require mixing data from both clients. A backup system may segregate Company A from Company B, provide unique intermediate shared storages for each, and unique server storages for each.

Clients may be segregated into groups based on location. For example, clients in a building may be grouped together, while clients in another building may be segregated into a different group. Geographical location need not be limited to different buildings in a corporate campus. Client groups may just as easily be segregated based on which state a client resides in, which time zone, which coast, which country, etc. There are numerous ways to segregate clients into groups.

The restore process of a backup of the present invention may be similar to that of the backup process. Referring to FIG. 1, a server 104 may receive a request to restore data on a client 100. Due to the intermittent connections of the client 100, server 104 may temporarily send data to intermediate shared storage 102 as a staging ground before the final transfer to client 100. Once client 100 is connected to intermediate shared storage 102 (e.g. when it is convenient for client 100), client 100 may retrieve the data from intermediate shared storage 102.

Figure 4:
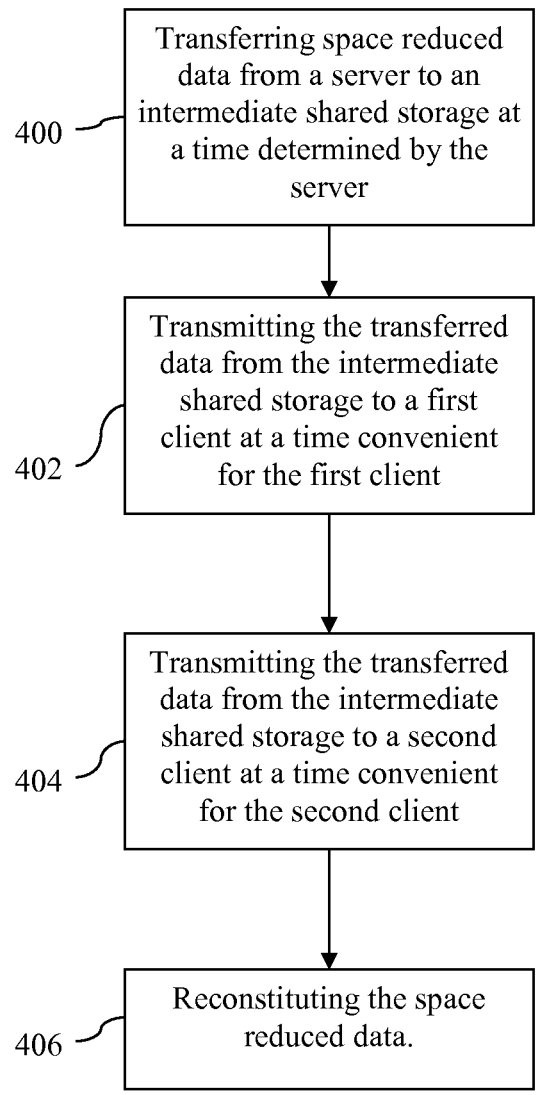
FIG. 4 is a flowchart of a method to restore information in accordance with the invention.

FIG. 4 illustrates a process to restore data in an embodiment of the invention, comprising transferring space reduced data from a server to an intermediate shared storage at a time determined by the server in step 400, transmitting the transferred data from the intermediate shared storage to a first client at a time convenient for the first client in step 402, transmitting the transferred data from the intermediate shared storage to a second client at a time convenient for the second client in step 404, and reconstituting the space reduced data in step 406.

Depending on user preference, server 104 may reconstitute space reduced data before sending it to intermediate shared storage 102. However, reconstituting space reduced data would increase bandwidth consumption between server 104 and intermediate shared storage 102, as well as require server 104 to process the data. Similarly, intermediate server 108 may reconstitute space reduced data before client 100 retrieves the data. However, this would increase bandwidth consumption between intermediate shared storage 102 and client 100. The least bandwidth intensive method would be client 100 to reconstitute the space reduced data. This way, only space reduced data is sent through the network. However, this requires that client 100 understand how to reconstitute the space reduced data.

For the sake of clarity, the processes and methods herein have been illustrated with a specific flow, but it should be understood that other sequences may be possible and that some may be performed in parallel, without departing from the spirit of the invention. Additionally, steps may be subdivided or combined. As disclosed herein, software written in accordance with the present invention may be stored in some form of computer-readable medium, such as memory or CD-ROM, or transmitted over a network, and executed by a processor.

Though the above has been described with reference to the term "backup" for illustrative purposes, the present invention is equally applicable to all forms of data duplication. These forms of data duplication include replication and archiving, among others.

All references cited herein are intended to be incorporated by reference. Although the present invention has been described above in terms of specific embodiments, it is anticipated that alterations and modifications to this invention will no doubt become apparent to those skilled in the art and may be practiced within the scope and equivalents of the appended claims. More than one computer may be used, such as by using multiple computers in a parallel or load-sharing arrangement or distributing tasks across multiple computers such that, as a whole, they perform the functions of the components identified herein; i.e. they take the place of a single computer. Various functions described above may be performed by a single process or groups of processes, on a single computer or distributed over several computers. Processes may invoke other processes to handle certain tasks. A single storage device may be used, or several may be used to take the place of a single storage device. The present embodiments are to be considered as illustrative and not restrictive, and the invention is not to be limited to the details given herein. It is therefore intended that the disclosure and following claims be interpreted as covering all such alterations and modifications as fall within the true spirit and scope of the invention.

What is claimed is:

1. A method for storing data, comprising:
receiving information about a plurality of clients;
grouping clients into client groups based on the information, wherein the client groups have an intermittent connection to an intermediate shared server, said intermediate shared server comprising an intermediate shared storage;
asynchronously receiving deduplicated data from a client group on the intermediate shared server, wherein the data is received at a time convenient for the client group;
deduplicating the data a second time on the intermediate shared server;
storing the data in the intermediate shared storage as non-volatile data;
transferring the data to a server; and
storing the data in a server storage, wherein the stored data includes only single instance data.

2. The method as recited in claim 1, wherein information about a plurality of clients includes information about the geographical location of each of the plurality of clients.

3. The method as recited in claim 1, wherein information about a plurality of clients includes information about the department of each of the plurality of the clients.

4. The method as recited in claim 1, wherein transmitting data from a client group to an intermediate shared storage includes transmitting data from one client group to one intermediate shared storage.

5. The method as recited in claim 1, wherein an intermediate shared storage includes a plurality of intermediate shared storages.

6. The method as recited in claim 5, wherein transmitting data from a client group to a plurality of intermediate shared storages includes transmitting data from a plurality of client groups to a plurality of intermediate shared storages.

7. The method as recited in claim 1, wherein grouping clients into client groups based on the information includes grouping clients into client groups based on the likelihood of the clients having redundant data.

8. A system for storing data, comprising:
a plurality of clients;
an intermediate shared server;
an intermediate shared storage;
a server;
a server storage; and
a processor configured to:
receive information about a plurality of clients;
group clients into client groups based on the information, wherein the client groups have an intermittent connection to the intermediate shared storage;
asynchronously receive deduplicated data from a client group on the intermediate shared server, wherein the data is received at a time convenient for the client group;
deduplicate the data a second time on the intermediate shared server;
store the data in the intermediate shared storage as non-volatile data;
transfer the data to a server; and
store the data in a server storage, wherein the stored data includes only single instance data.

9. A computer program product for storing data, comprising a non-transitory computer readable medium having program instructions embodied therein for:
receiving information about a plurality of clients;
grouping clients into client groups based on the information, wherein the client groups have an intermittent connection to an intermediate shared server, said intermediate shared server comprising an intermediate shared storage;
asynchronously receiving deduplicated data from a client group on the intermediate shared server, wherein the data is received at a time convenient for the client group;
deduplicating the data a second time on the intermediate shared server;
storing the data in the intermediate shared storage as non-volatile data;
transferring the data to a server; and
storing the data in a server storage, wherein the stored data includes only single instance data.

* * * * *